United States Patent [19]
Gaebe et al.

[11] Patent Number: 5,973,853
[45] Date of Patent: Oct. 26, 1999

[54] CRUCIFORM CYLINDRICAL LENS FOR ELLIPTICAL BEAM TRANSFORMATION

[75] Inventors: Carl Edward Gaebe, Fleetwood; Sun-Huan Huang, Maidencreek Township, Berks County; Kimberly A. Miller, Fleetwood; Thomas Stanley Stakelon, Allentown; Gary T. Wiand, East Conventry Township, Chester County, all of Pa.

[73] Assignee: Lucent Technologies, Inc., Murray Hill, N.J.

[21] Appl. No.: 09/073,544

[22] Filed: May 6, 1998

[51] Int. Cl.$^6$ .............. G02B 13/08; G02B 3/06; G02B 9/00; G02B 6/32
[52] U.S. Cl. .......... 359/668; 359/710; 359/796; 385/34
[58] Field of Search ................ 359/668, 670, 359/671, 710, 796; 385/34, 33, 35

[56] References Cited

U.S. PATENT DOCUMENTS

| | | | |
|---|---|---|---|
| 2,303,113 | 11/1942 | Eckel | 359/710 |
| 3,652,150 | 3/1972 | Berreman | 359/710 |
| 4,203,652 | 5/1980 | Hanada | 359/710 |
| 4,253,735 | 3/1981 | Kawamura et al. | 359/710 |
| 4,318,594 | 3/1982 | Hanada | 359/710 |
| 4,362,367 | 12/1982 | Hammer et al. | 359/710 |
| 4,530,574 | 7/1985 | Scifres et al. | 359/710 |
| 4,744,073 | 5/1988 | Sugiki | 359/668 |
| 5,095,386 | 3/1992 | Scheibengraber | 359/710 |
| 5,181,224 | 1/1993 | Snyder | 359/710 |
| 5,499,262 | 3/1996 | Nakata | 359/668 |
| 5,844,723 | 12/1998 | Synder | 359/668 |

FOREIGN PATENT DOCUMENTS

| | | | |
|---|---|---|---|
| 2921-857 | 12/1980 | Germany | 359/668 |
| 57-204018 | 12/1982 | Japan | 359/668 |
| 61-109015 | 5/1986 | Japan | 359/668 |
| 61-282813 | 12/1986 | Japan | 359/668 |

Primary Examiner—Georgia Epps
Assistant Examiner—Evelyn A. Lester

[57] ABSTRACT

A system for providing efficient coupling between an elliptical mode laser source and a single mode transmission fiber is disclosed. In one embodiment, the system comprises a cruciform cylindrical lens formed as a pair of perpendicular cylindrical lenses to provide for separate magnification of the "fast" diverging component (i.e., this component passes through a "fast" cylindrical lens) and the "slow" diverging component of the beam (i.e., this component passes through a "slow" cylindrical lens). By decoupling the magnification requirements of the components of the elliptical beam, the beam may be transformed into an essentially circular beam, appropriate for coupling into a single mode fiber. In one arrangement of the present invention, a coupling efficiency of approximately 90% is possible (as compared with prior art coupling efficiency of about 44%). In an alternative embodiment, the pair of cylindrical lenses may be replaced by a monolithic lens, formed to comprise orthogonal front and rear cylindrical surfaces.

4 Claims, 3 Drawing Sheets

CRUCIFORM CYLINDRICAL LENS FOR ELLIPTICAL BEAM TRANSFORMATION

TECHNICAL FIELD

The present invention relates to a cruciform cylindrical lens for increasing the coupling efficiency of an elliptical beam into a conventional single mode fiber.

BACKGROUND OF THE INVENTION

There are a variety of semiconductor lasers that emit an elliptical beam. For example, many GaAs-based lasers operating at wavelengths such as 650, 780, 810 and 850 nm all emit an elliptical beam. In particular, a conventional 980 nm InGaAs laser, often used as a pump laser source for optical amplification systems, emits such an elliptical beam. Since the associated optical systems utilize transmission fibers with a circular core, much of the launched power may be lost. In particular, conventional optical systems will capture only approximately 40% of the launched power from an elliptical beam.

One known solution to this problem is to utilize an anamorphic fiber micro-lens, which achieves a coupling efficiency of about 70%. However, the microlens requires very stringent alignment tolerances. Additionally, the ellipticity of the launched beam may vary, depending upon the manufacturer (for example, the ratio of far-field angles between the vertical and horizontal directions can vary from 2.5 to 4.5, depending upon the manufacturer). Thus, even the best anamorphic microlens design may not be suitable for all situations.

Therefore, a need remains in the art for a system of improving the coupling efficiency of elliptical beams into a single mode optical fiber.

SUMMARY OF THE INVENTION

The need remaining in the prior art is addressed by the present invention, which relates to an optical coupling arrangement incorporating a cruciform cylindrical lens and, more particularly, to a lens system where a cruciform cylindrical lens replaces a conventional collimating lens to transform an elliptical beam output from a laser source into an essentially symmetrical beam suitable for coupling into a single mode fiber. As used herein, the term "cruciform" refers to a component formed or arranged in the shape of a cross.

In one embodiment of the present invention, a two-element (or "discrete") cruciform cylindrical lens is formed by combining a pair of cylindrical lenses whose symmetry axes are disposed perpendicular to one another. The pair of lenses are inserted in the optical beam path between a laser source and a single mode fiber such that the first cylindrical lens has its main axis along the optical system's X axis and is used to focus the beam component present in the most divergent direction (i.e., the Y axis direction, also referred to as the "fast axis"). The second cylindrical lens has its main axis along the system's Y axis and is therefore used to focus the component present in the least divergent direction (i.e., the X axis direction, also referred to as the "slow axis").

In an alternative embodiment, the discrete, two-element cruciform cylindrical lens may be replaced by a monolithic cruciform cylindrical lens structure. In this alternative embodiment, the monolithic cruciform cylindrical lens is formed to comprise opposing cylindrical endfaces, a first endface having its main axis along the system's X axis and the second endface having its main axis along the system's Y axis.

It is an advantage of the arrangement of the present invention that the utilization of a cruciform cylindrical lens improves the alignment tolerance of an optical system when compared with conventional anamorphic lens arrangements. That is, the ability to separately control the beam magnification along each axis allows the user to tailor the lens design to the specific optical system.

Other and further advantages of the present invention will become apparent during the course of the following discussion and by reference to the accompanying drawings.

BRIEF DESCRIPTION OF THE DRAWINGS

Referring now to the drawings, where like numerals represent like parts in several views.

DETAILED DESCRIPTION

Figure 1:
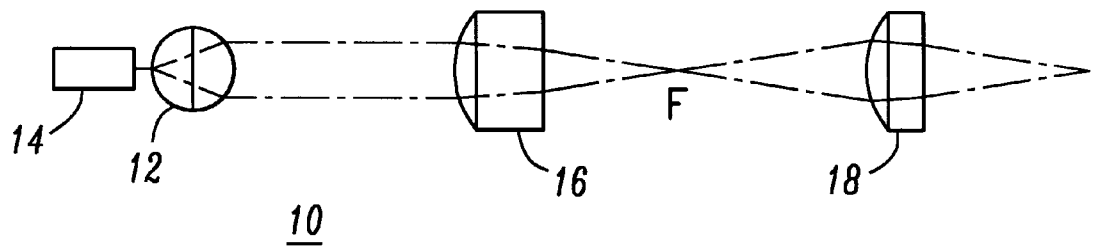
FIG. 1 illustrates a prior art lensing system used for coupling a laser output beam into a conventional single mode transmission fiber.

A conventional prior art lens system 10 illustrated in FIG. 1. A ball lens 12 is positioned in front of a laser diode 14 so as to collect the divergent beam. As shown, the beam is essentially collimated after it passes through ball lens 12. A field lens 16 is disposed to focus the collimated beam, and the beam thereafter passes through a focal point F and again begins to diverge. The divergent beam is then intercepted by a third lens 18 that corrects for spherical aberration and re-focuses the beam. As the beam propagates through this system, the ellipticity is not corrected.

Figure 2:
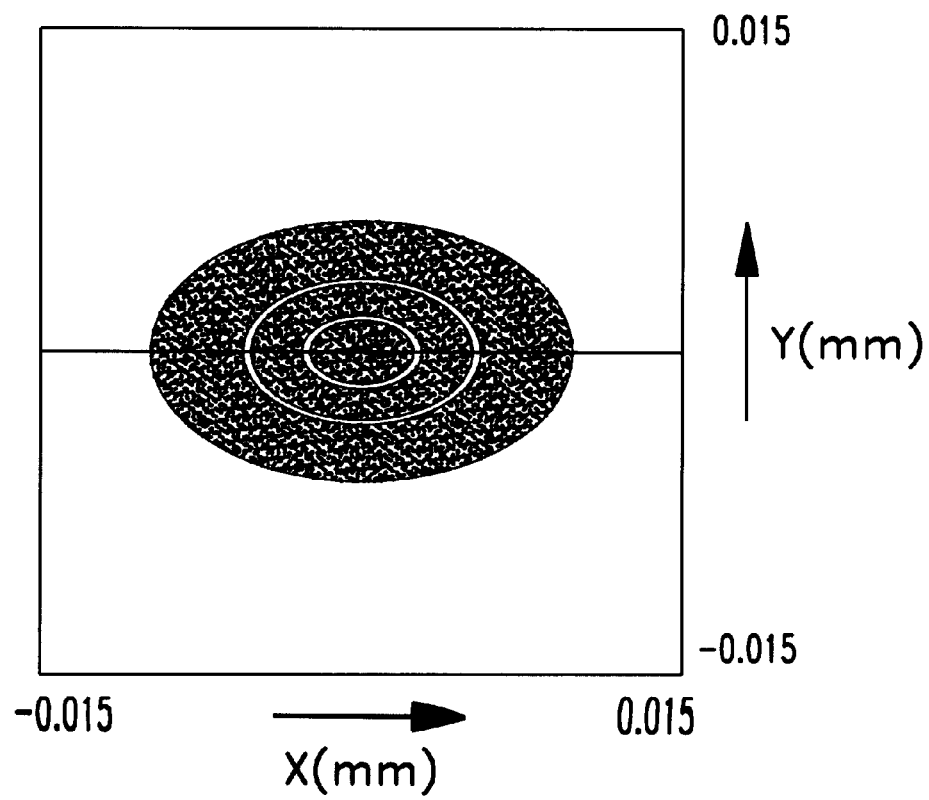
FIG. 2 is an illustration of a typical elliptical output beam from the prior art arrangement of FIG. 1.

When a conventional 980 nm pump laser propagates through a system such as system 10 of FIG. 1, the horizontal far-field angle may vary from 6° to 12° (FWHM), and the vertical far-field may vary from 20° to 35° (FWH). An exemplary pair of angles may be 9° for the horizontal and 30° for the vertical. FIG. 2 is a graph of a conventional exit beam pattern associated with prior art lens system 10. As shown, the X axis mode field is approximately 16.9 $\mu$m and the Y axis mode field is approximately 9.2 $\mu$m. Since a typical single mode fiber has a mode field diameter of 6.4 $\mu$, a significant amount of the optical power will not be coupled into the fiber. Indeed, most conventional lens systems exhibit a coupling efficiency of approximately 44%.

Figure 3:
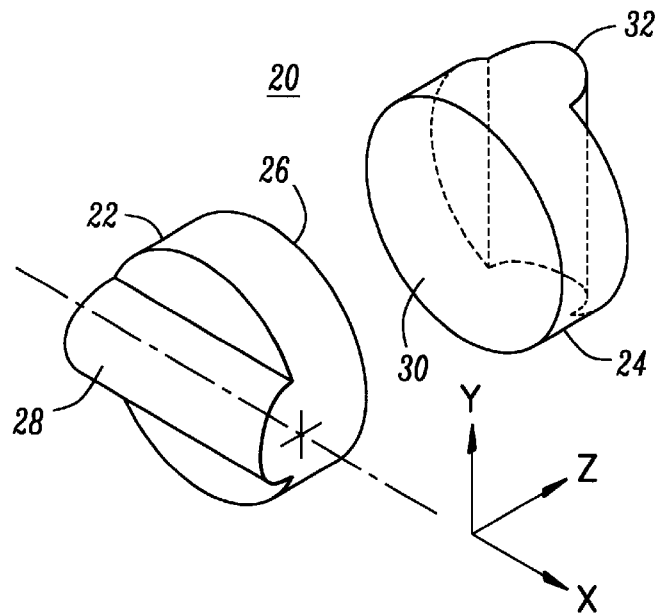
FIG. 3 is an isometric view of an exemplary discrete cruciform cylindrical lens for use in the system of the present invention.

In accordance with the teachings of the present invention and shown by theoretical modeling of the system, the coupling efficiency is improved to a value of approximately 90% by replacing lens 18 with a properly designed and oriented cruciform cylindrical lens. FIG. 3 is an isometric view of an exemplary cruciform cylindrical lens 20. As shown, cruciform cylindrical lens 20 comprises a first cylindrical lens 22 and a second cylindrical lens 24. First cylindrical lens 22 comprises a flat rear surface 26 (not shown) and a cylindrical front surface 28. When placed in an optical system, first cylindrical lens 22 is disposed such that the main axis of cylindrical front surface 28 is along the X direction of the optical system, as indicated in FIG. 3. In accordance with the teachings of the present invention, first cylindrical lens 22 is therefore used to focus the light signal present along the "fast diverging" (Y axis) direction (thus, first cylindrical lens 22 may also be referred to as the "fast lens"). Second cylindrical lens 24, as shown in FIG. 3, includes a flat front surface 30 and a cylindrical rear surface 32. When disposed in the optical system, the main axis of second cylindrical lens 24 is oriented perpendicular to that of first cylindrical lens 22 (that is, such that the main axis of the cylindrical portion of second lens 24 is along the system Y axis) and disposed such that rear surface 26 of first lens 22 is parallel to front surface 30 of second lens 24. As shown in FIG. 3, lens 24 is oriented such that the main axis of cylindrical rear surface 32 is aligned with the Y-axis of the optical system. With this orientation, second cylindrical lens 24 is used to focus the light signal present along the "slow diverging" (X-axis) direction.

In order to provide "matching" of the mode fields between an elliptical source and a circular single mode fiber, a cruciform cylindrical lens of the present invention is formed to provide separate magnification along the X axis and the Y axis. That is, first lens 22 is formed to include a cylindrical lens surface 28 appropriate for the Y axis magnification and second lens 24 is formed to include a cylindrical lens surface 32 appropriate for the X axis magnification. By virtue of separating the magnification along the axes, better mode matching may be achieved.

Figure 4:
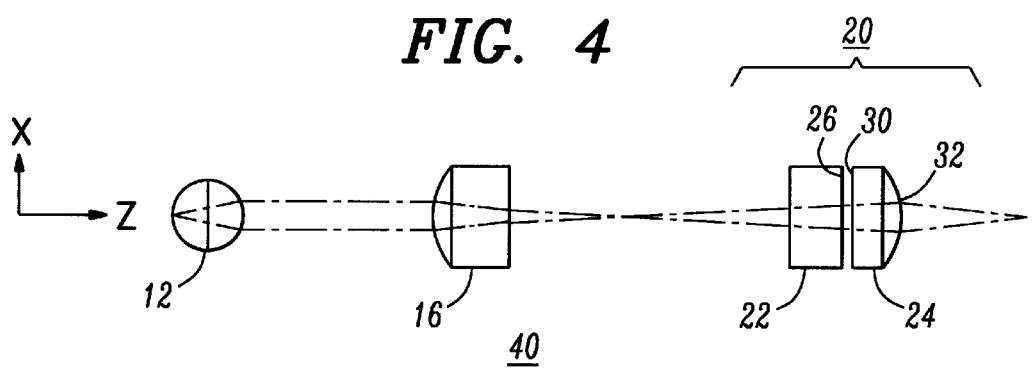
FIG. 4 is an X-Z view of an optical system of the present invention, utilizing the discrete cruciform lens of FIG. 3 in place of the second collimating lens.
Figure 5:
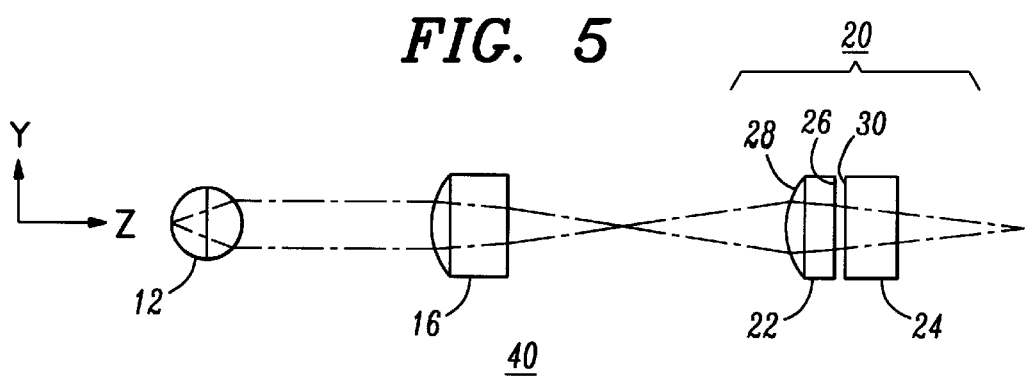
FIG. 5 is a Y-Z view of the optical system of FIG. 4.

FIGS. 4 and 5 illustrate two different (in this case, perpendicular) views of an exemplary lens system 40 incorporating cruciform cylindrical lens 20 of the present invention. FIG. 4 is a view in the X-Z plane of lens system 40. Similar to the conventional prior art system, lens system 40 includes spherical lens 12 disposed at the output of a laser source (not shown). A second lens 16 is disposed as discussed above to intercept the collimated (but still elliptical) output beam exiting spherical lens 12. In accordance with the teachings of the present invention, cruciform cylindrical lens 20 is disposed in the optical system beyond lens 16, generally at the prior location of the third lens in the conventional arrangement of FIG. 1. Referring to FIG. 4, cruciform cylindrical lens 20 is oriented, in the X-Z plane such that the "slow" diverging light signal will travel through cylindrical surface 32 of second lens 24. Referring to FIG. 5, cruciform cylindrical lens 20 is oriented in the Y-Z plane such that the "fast" diverging light signal will travel through cylindrical surface 28 of first lens 22. In one particular embodiment, first lens 22 may comprise a thickness of approximately 0.8 mm and exhibit a radius of curvature along the Y axis, $R_y$, of 1.0049 mm (with a fourth-order aspheric coefficient $A_{4y}$ of $-0.325$ mm$^{-4}$, the radius of curvature along the X axis for first lens 22 being infinity). Second lens 24 may also comprise a thickness of 0.8 mm, and exhibits a radius of curvature along the X axis, $R_x$, of $-0.715$ mm, where $A_{4x}$ is approximately 0.6612 mm$^{-4}$.

Figure 6:
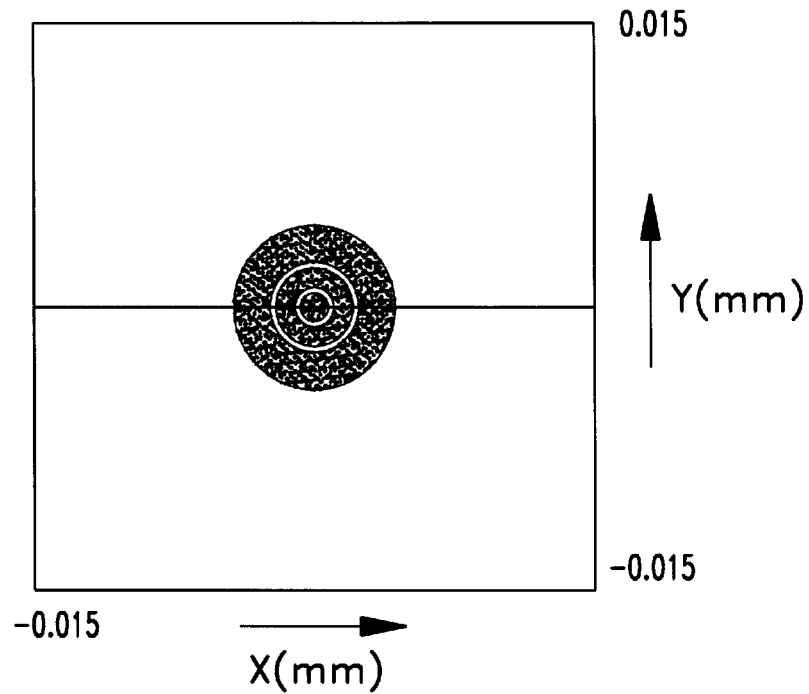
FIG. 6 is a diagram illustrating the essentially circular output from the optical coupling system of the present invention.

The exit beam pattern associated with these exemplary lens values is shown in the diagram of FIG. 6. By providing an optical magnification of 1.68 in the X direction and 4.67 in the Y direction, the exemplary cruciform cylindrical lens dimensions defined above were capable of producing an output beam with an X axis mode field of 6.6 μm and a Y axis mode field of 6.4 μm. The coupling efficiency for this theoretical model is approximately 90%, a more than 50% improvement over the prior art arrangement.

Figure 7:
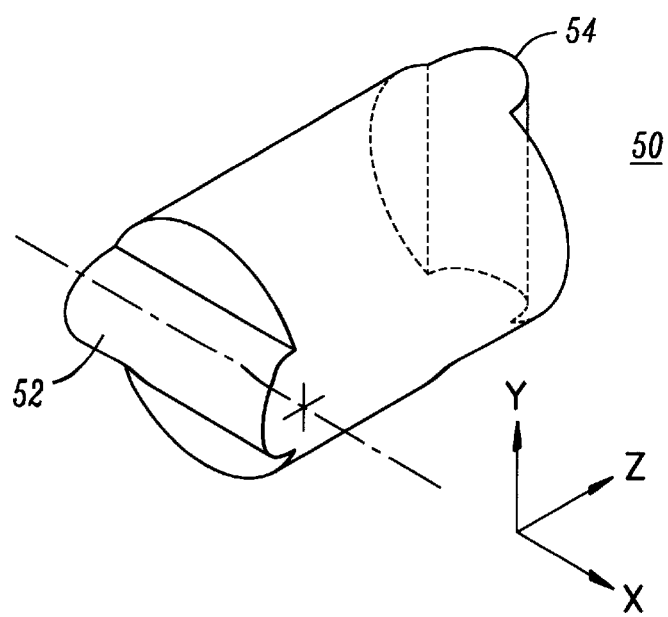
FIG. 7 is an isometric view of an exemplary monolithic cruciform cylindrical lens useful in the optical system of the present invention.

In most arrangements employing the cruciform cylindrical lens of the present invention, first lens 22 and second lens 24 have their rear and front surfaces 26 and 30, respectively, separated by a relatively small gap (approximately 1 mm, for example). Therefore, in accordance with the present invention, a monolithic cruciform cylindrical lens may be used in place of a pair of discrete cylindrical lenses. FIG. 7 illustrates an exemplary monolithic cruciform cylindrical lens 50. Lens 50 includes a first cylindrical surface 52 with its main axis oriented along the X axis of the optical system and a second cylindrical surface 54 with its main axis oriented along the Y axis of the optical system. The utilization of a monolithic structure results in reduced assembly time (since the necessary axes are inherently perpendicular, no alignment during assembly is required) and reduced optical loss (fewer surfaces for the optical signal to encounter).

It is to be understood that the various numeric values discussed above are exemplary only, and the optical system of the present invention incorporating a cruciform cylindrical lens may utilize any magnification values required to transform an emitted elliptical beam into an essentially circular beam.

What is claimed is:

1. A lens system for converting an elliptical optical beam defined as exhibiting a first, fast axis component and a second, slow axis component, into an essentially circular optical beam, the lens system defined along an X-Y-Z coordinate system and comprising a first and a second lens for intercepting an elliptical beam; and a cruciform cylindrical lens disposed to intercept the output from the second lens, said cruciform cylindrical lens defined as comprising a first, front cylindrical surface oriented along the X axis of the coordinate system for magnifying the first, fast axis component and a second, rear cylindrical surface oriented along the Y-axis of the coordinate system for magnifying the second, slow axis component, wherein the magnifications are determined to provide an essentially circular output beam, said cruciform cylindrical lens disposed such that the optical beam exiting the second lens impinges the first, front cylindrical surface.

2. A lens system as defined in claim 1 wherein the cruciform cylindrical lens comprises a first cylindrical lens including the first, front cylindrical surface and a flat rear surface, and a second cylindrical lens including the second, rear cylindrical surface and a flat front surface, said first and second cylindrical lenses disposed such that the respective flat surfaces are adjacent and parallel and the cylindrical surfaces are perpendicular.

3. A lens system as defined in claim 1 wherein the cruciform cylindrical lens is monolithic.

4. A lens system as defined in claim 1 wherein the first lens comprises a spherical lens for generating a collimated elliptical beam, the output from the spherical lens applied as the input to the second lens.

* * * * *